United States Patent
Takayoshi et al.

[19]

[11] Patent Number: 6,008,564
[45] Date of Patent: Dec. 28, 1999

[54] DRIVER CIRCUIT FOR PIEZOELECTRIC TRANSFORMER

[75] Inventors: Hirokazu Takayoshi; Naoki Furuhashi; Shingo Kawashima, all of Tokyo, Japan

[73] Assignee: NEC Corporation, Tokyo, Japan

[21] Appl. No.: 09/014,575

[22] Filed: Jan. 28, 1998

[30] Foreign Application Priority Data

Jan. 28, 1997 [JP] Japan .................................. 9-014228

[51] Int. Cl.[6] .............................................. H01L 41/107
[52] U.S. Cl. ........................................................... 310/318
[58] Field of Search .............................. 310/316.01, 318, 310/357, 359

[56] References Cited

U.S. PATENT DOCUMENTS

| | | | |
|---|---|---|---|
| 5,731,652 | 3/1998 | Shimada | 310/316 |
| 5,739,622 | 4/1998 | Zaitsu | 310/316 |
| 5,796,213 | 8/1998 | Kawasaki | 315/209 R |
| 5,854,543 | 12/1998 | Satoh et al. | 315/307 |
| 5,872,419 | 2/1999 | Hall et al. | 310/359 |

*Primary Examiner*—Thomas M. Dougherty
*Attorney, Agent, or Firm*—Young & Thompson

[57] ABSTRACT

The present invention provides a driving circuit for a piezoelectric transformer. The driving circuit comprises a driver circuit and a detector circuit. The driver circuit is electrically connected to a primary side of the piezoelectric transformer for generating a driving signal which is transmitted to the primary side of the piezoelectric transformer so that the piezoelectric transformer exhibits a vibration due to piezoelectric effect and generates a transformed output voltage on a secondary side thereof. The detector circuit is electrically connected to an output side of the driver circuit for receipt of the driving signal from the driver circuit and also electrically connected to the secondary side of the piezoelectric transformer for receipt of the transformed output voltage from the piezoelectric transformer so that the detector circuit is capable of detecting a drop of the transformed output voltage when a voltage level of the driving signal is in an available range.

12 Claims, 4 Drawing Sheets

DRIVER CIRCUIT FOR PIEZOELECTRIC TRANSFORMER

BACKGROUND OF THE INVENTION

The present invention relates to a driver circuit for a piezoelectric transformer, and more particularly to a driver circuit for a piezoelectric transformer to be used as a back-light power source of a liquid crystal display device.

The piezoelectric transformer is a voltage converter which shows a mechanical vibration due to piezo effect so that a converted or transformed voltage appears on a secondary side of the converter. A piezoelectric vibrator is made of a piezoelectric material showing piezo effect. Primary and secondary electrodes are provided at primary and secondary sides of the piezoelectric vibrator. The primary electrode is applied with a driving voltage which has the same frequency as a resonant frequency of the piezoelectric resonator so that the piezoelectric resonator exhibits a vibration at the resonant frequency. The piezoelectric transformer is superior in allowability of scaling down and thickness reduction as compared to an electromagnetic transformer, for which reason the piezoelectric transformer is suitable for a back-light power source in the liquid crystal display device.

A conventional driving circuit for such a piezoelectric transformer is disclosed in the Japanese laid-open patent publication No. 7-177736. The conventional driving circuit and the piezoelectric transformer have a protection feature which prevents them from substantial damage. FIG. 1 is a block diagram illustrative of the conventional driving circuit for the piezoelectric transformer. The driver circuit has a piezoelectric transformer 4 which has a primary electrode applied with an alternating current and a secondary electrode on which an output voltage appears which has been transformed by the piezoelectric effect. A power source VDD is provided which is electrically connected through a power switch 406 to the primary electrode of the piezoelectric transformer 4. An output voltage detector 403 is also provided which is electrically connected to the secondary electrode of the piezoelectric transformer 4. A comparator 404 is also provided which is electrically connected to the output voltage detector 403 for comparison of the detected output voltage to a reference voltage. A control unit 405 is further provided which is connected to the power switch 406 and the comparator 404 for sending the power switch 406 a control signal based upon the result of the comparison. A display device 407 is furthermore provided which is electrically connected to the comparator 404 for displaying the result of the comparison. A load 5 is also provided between the secondary electrode of the piezoelectric transformer 4 and the ground.

If the detected output voltage level is beyond the reference voltage, the control unit 405 sends the power switch 406 an instruction to stop the power supply.

FIG. 2 is a circuit diagram illustrative of the output voltage detector 403, the comparator 404 and the display device 407 of FIG. 1. Operations of the conventional driver circuit will be described as follows. A comparator 503 is provided in the comparator 404 for outputting a high voltage level when the output voltage level of the piezoelectric transformer 4 is below the available range. A comparator 505 is provided in the comparator 404 for outputting a high voltage level when the output voltage level of the piezoelectric transformer 4 is above the available range. A comparator 504 is provided in the comparator 404 for outputting a high voltage level when the output voltage level of the piezoelectric transformer 4 is in the available range.

If, for example, the piezoelectric transformer 4 is broken and the output voltage appearing on the secondary electrode is dropped to a lower level than the available voltage range, then the comparator 503 outputs the high level signal to send an OFF signal through a latch 506 to the power switch 406. If the load 5 is opened and the load impedance rapidly increases, then the output voltage level of the piezoelectric transformer 4 is rapidly increased whereby the piezoelectric transformer 4 exhibits an excess vibration. As a result, the output voltage level from the secondary electrode of the piezoelectric transformer 4 is beyond the available voltage range. In this case, the comparator 505 outputs a high level signal which is transmitted through the latch 507 to a light emitting diode 510 whereby the light emitting diode 510 enters into the light-ON as well as send OFF signal to the power switch 406. If the output voltage is in the available range, then the comparator 504 is operated and the light emitting diode 509 lights ON. If the piezoelectric transformer 4 is broken, then the protection circuit is operated to stop the power supply to prevent a discharge from the broken part thereof.

The above protection circuit described above has the following problems. The first problem is that even if no break appears but an output voltage is dropped to a lower voltage level than the available voltage range, the power switch turns OFF and will remain in the OFF state. The above piezoelectric transformer is the voltage converter which shows a mechanical vibration due to piezo effect so that a converted or transformed voltage appears on a secondary side of the converter. Immediately after the power-on, it takes a time to achieve the predetermined output voltage level.

FIG. 3 is a time chart showing one characteristic of rising up of the driving of the piezoelectric transformer 4. The necessary driving time duration, or a time duration, from the initiation of the supply of a driving voltage with a resonant frequency to a predetermined output voltage level was about 150 microseconds. The driving circuit for the piezoelectric transformer sweeps the driving frequency of the piezoelectric transformer to set the frequency at an appropriate driving frequency. Actually, this sweeping time is essential. The sweeping time depends upon the driving circuit and is, for example, a few milliseconds to several tens of milliseconds. For this reason, immediately after the power-on, no output voltage is generated. At this time, the conventional driving circuit is considered to be in the abnormal state and then the power switch turns OFF and will remain the OFF state.

If a battery is used as the power source, there is a problem in any insufficient power supply due to consumption of the power. In this case, if the driving is made at the resonant frequency allowing a maximum power voltage, it might be difficult to generate the necessary voltage level for lighting a cathode tube. In this case, the power switch turns OFF to discontinue the power supply. Even if the power source voltage is returned to a rated value, then the power switch remains OFF whereby the cathode tube does not light ON.

If the output voltage is above the available range, then the power switch 406 turns OFF and will remain in the OFF state. If, for example, no light-ON state can be obtained due to a high impedance of the cathode tube on the ground of a low atmospheric temperature. In case of the load opening state due to electrical content imperfection, the output voltage level of the piezoelectric transformer is rapidly increased up to a higher voltage level than the available voltage range whereby the power supply is discontinued. Even if the atmospheric temperature is increased or the electrical contact perfection can be obtained, then the power switch remains OFF whereby the cathode tube will not turn ON.

In the above circumstances, it had been required to develop a novel driving circuit for a piezoelectric transformer free from the above problems.

SUMMARY OF THE INVENTION

Accordingly, it is an object of the present invention to provide a novel driving circuit for a piezoelectric transformer free from the above problems.

The above and other objects, features and advantages of the present invention will be apparent from the following descriptions.

The present invention provides a driving circuit for a piezoelectric transformer. The driving circuit comprises a driver circuit and a detector circuit. The driver circuit is electrically connected to a primary side of the piezoelectric transformer for generating a driving signal which is transmitted to the primary side of the piezoelectric transformer so that the piezoelectric transformer exhibits a vibration due to piezoelectric effect and generates a transformed output voltage on a secondary side thereof. The detector circuit is electrically connected to an output side of the driver circuit for receipt of the driving signal from the driver circuit and also electrically connected to the secondary side of the piezoelectric transformer for receipt of the transformed output voltage from the piezoelectric transformer so that the detector circuit is capable of detecting a drop of the transformed output voltage when a voltage level of the driving signal is in an available range.

BRIEF DESCRIPTION OF THE DRAWINGS

Preferred embodiments according to the present invention will be described in detail with reference to the accompanying drawings.

DISCLOSURE OF THE INVENTION

Figure 1:
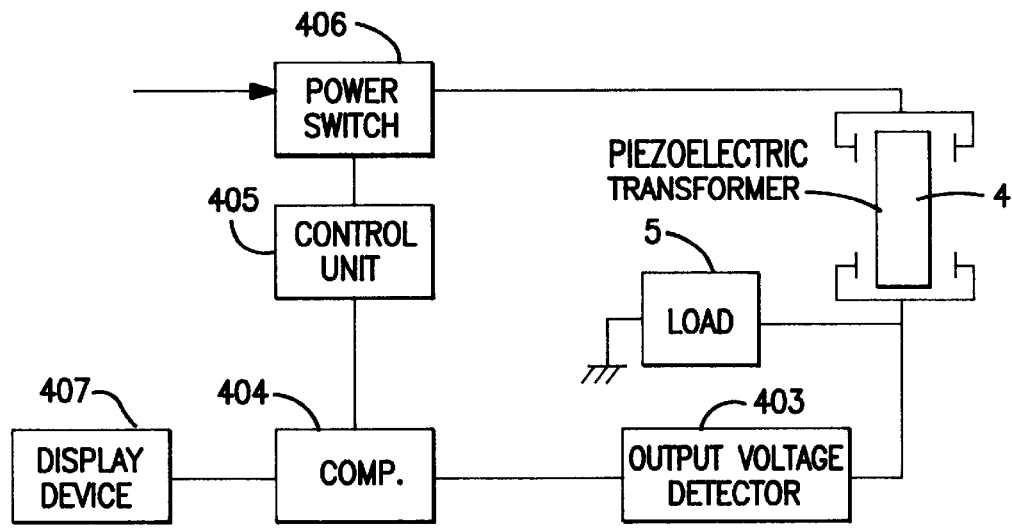
FIG. 1 is a block diagram illustrative of the conventional driving circuit for the piezoelectric transformer.
Figure 3:
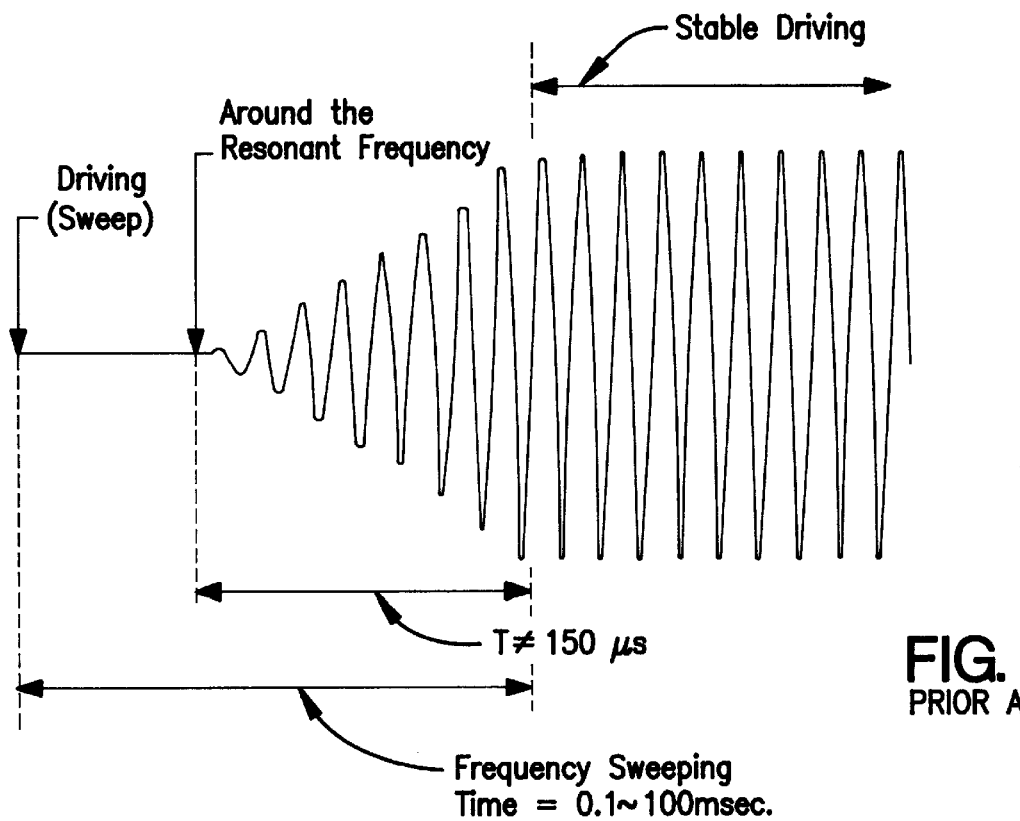
FIG. 3 is a time chart showing one characteristic of rising up of the driving of the piezoelectric transformer.
Figure 2:
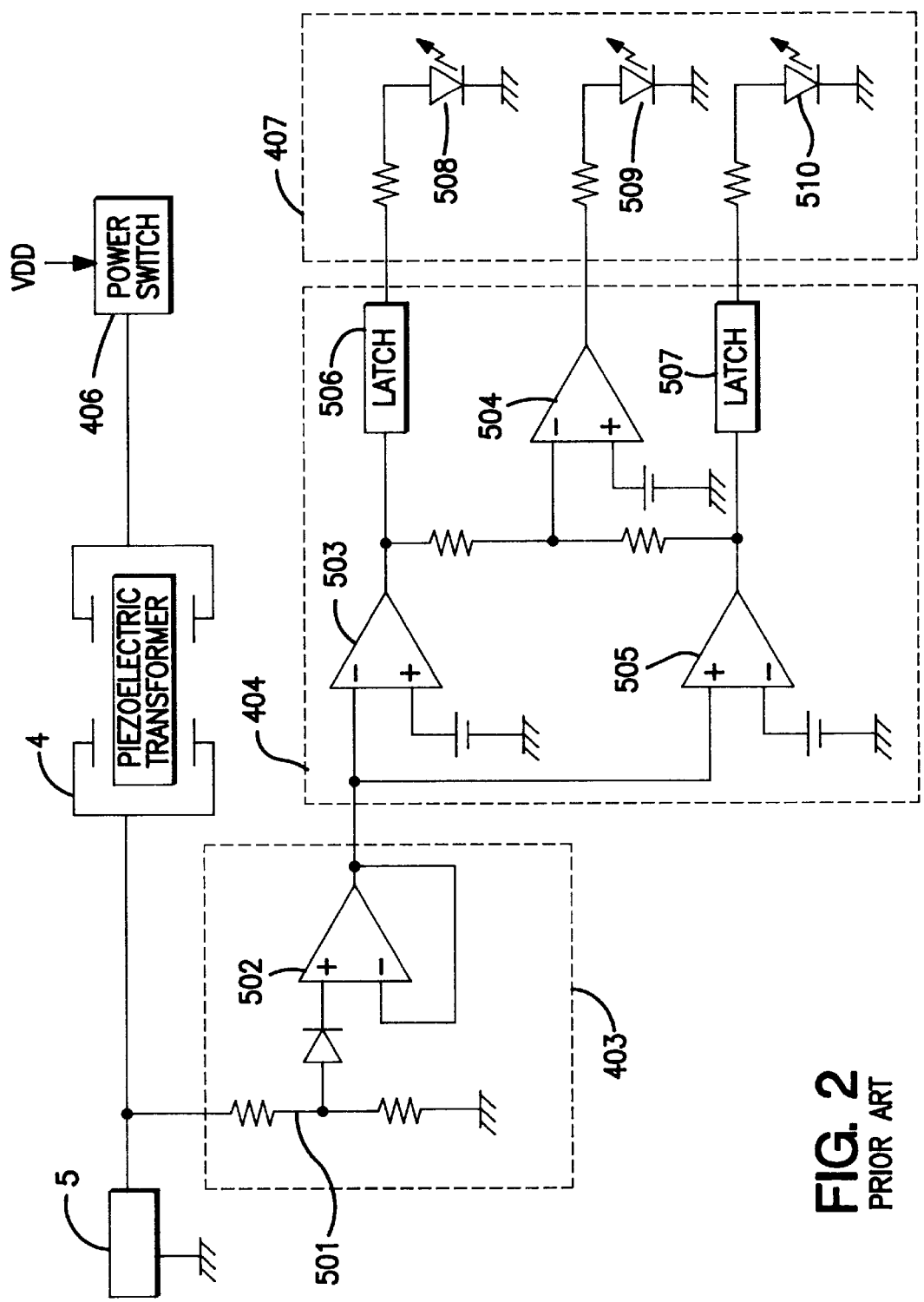
FIG. 2 is a circuit diagram illustrative of the output voltage detector, the comparator and the display device of FIG. 1.

The present invention provides a driving circuit for a piezoelectric transformer. The driving circuit comprises a driver circuit and a detector circuit. The driver circuit is electrically connected to a primary side of the piezoelectric transformer for generating a driving signal which is transmitted to the primary side of the piezoelectric transformer so that the piezoelectric transformer exhibits a vibration due to piezoelectric effect and generates a transformed output voltage on a secondary side thereof. The detector circuit is electrically connected to an output side of the driver circuit for receipt of the driving signal from the driver circuit and also electrically connected to the secondary side of the piezoelectric transformer for receipt of the transformed output voltage from the piezoelectric transformer so that the detector circuit is capable of detecting a drop of the transformed output voltage when a voltage level of the driving signal is in an available range.

It is possible that the detector circuit comprises a first comparator, a second comparator, a timer circuit and a logic gate circuit. The first comparator is electrically connected to the secondary side of the piezoelectric transformer for receipt of the transformed output voltage from the piezoelectric transformer so that the first comparator compares the transformed output voltage with a first reference voltage and then outputs a first comparison result signal. The second comparator is electrically connected to the output side of the driver circuit for receipt of the driving signal from the driver circuit so that the second comparator compares the driving signal with a second reference voltage and then outputs a second comparison result signal. The timer circuit is electrically connected to an input side of the driver circuit for time counting operations to output a timer signal for a predetermined time duration after commencement of the supply of the driving signal. The logic gate circuit is electrically connected to output sides of the first and second comparators and the timer circuit for receipt of the first and second comparison result signals and the timer signal for logical operators to output a detecting signal which indicates a drop of the transformed output voltage when a voltage level of the driving signal is in an available range.

A latch circuit may further be provided between an output side of the detector means and the driver means.

PREFERRED EMBODIMENTS

First Embodiment

A first embodiment according to the present invention will be described in detail with reference to FIG. 4 which is a block diagram illustrative of a novel driving circuit of a piezoelectric transformer. The driving circuit has a break-detection circuit 1 for detecting any break of a piezoelectric transformer 4 and outputting a judgement signal Vd of any break of the piezoelectric transformer 4. A latch circuit 2 is provided which is electrically connected to the output side of the break-detection circuit 1 for outputting an output discontinuation signal Ve when the latch circuit 2 receives the judgement signal Vd. A driving circuit 3 is provided which is electrically connected to the primary side of the piezoelectric transformer 4 and also electrically connected to the output side of the latch circuit 2. The driving circuit 3 receives a power voltage Von to supply a driving voltage Vin to the primary electrode of the piezoelectric transformer 4 whereby the piezoelectric transformer 4 is stated to be driven. If the driving circuit 3 receives the output discontinuation signal Ve from the latch circuit 2, then the driving circuit 3 stops the supply of the driving voltage Vin to the primary electrode of the piezoelectric transformer 4. A secondary side of the piezoelectric transformer 4 is also electrically connected to the input side of the break-detection circuit 1 and also connected through a load 5 to the ground.

The break-detection circuit 1 has the following elements. A comparator 11 is provided which is electrically connected to the secondary side of the piezoelectric transformer 4 for receipt of an output voltage Vo from the secondary side of the piezoelectric transformer 4 and subsequent comparison of the received output voltage Vo to a reference voltage VR1 to output a comparison result signal Va. A comparator 12 is provided which is electrically connected to the output side of the driving circuit 3 for receipt of the driving voltage Vin from the driving circuit 3 and subsequent comparison of the received driving voltage Vin to a reference voltage VR2 to output a comparison result signal Vb. A timer circuit 13 is provided which is electrically connected to the power source for receipt of the power voltage Von to start a time counting operation so that after a predetermined time has been passed, then a timer signal Vc outputs. An AND-gate 14 is provided which electrically connected to the output sides of the comparator 11 and 12 as well as the timer circuit 13 for receipts of the comparison result signal Va, the comparison result signal Vb and the timer signal Vc for subsequent logical operations to output a judgement signal Vd.

Figure 4:
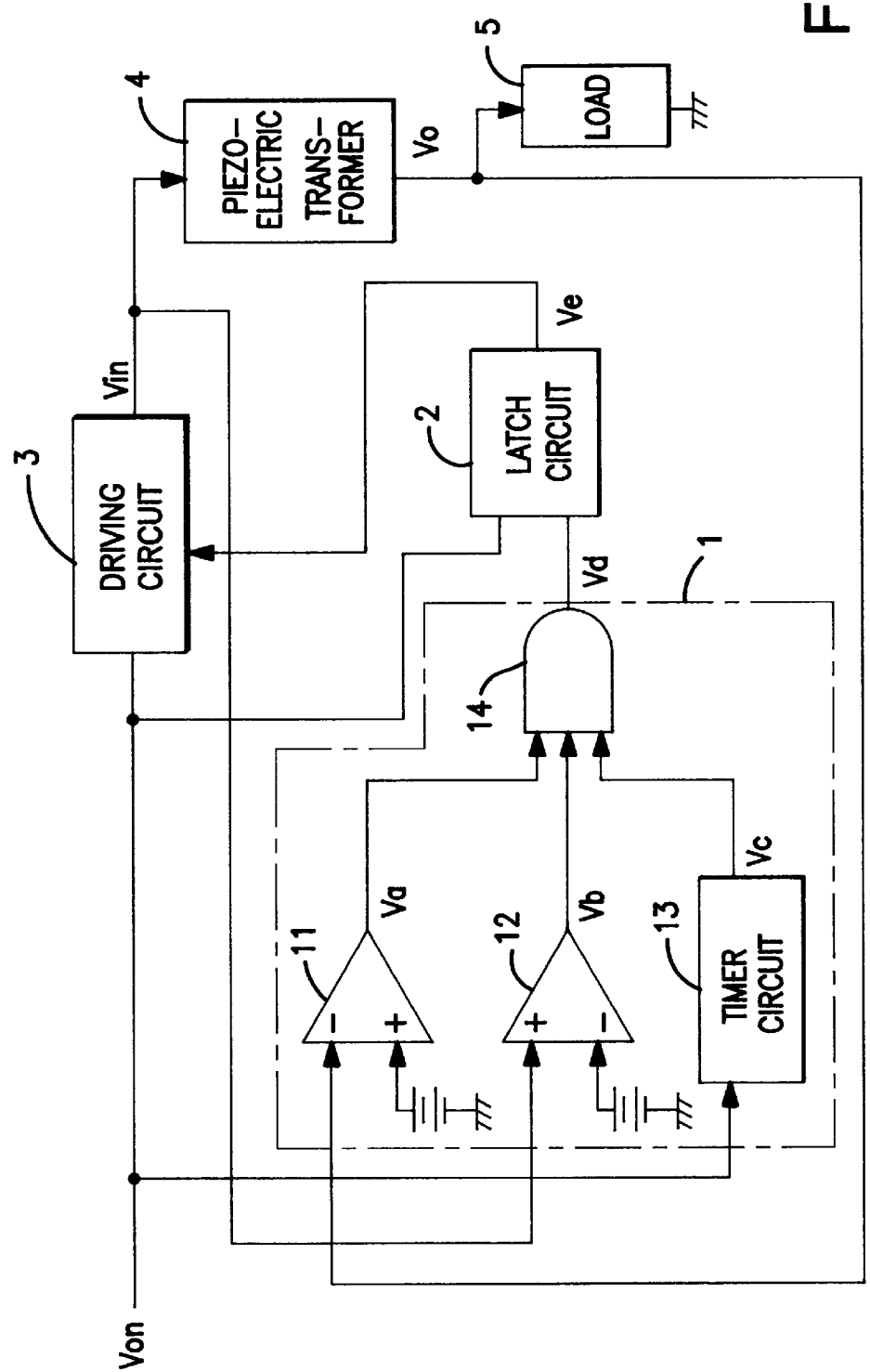
FIG. 4 is a block diagram illustrative of a novel driving circuit of a piezoelectric transformer in a preferred embodiment according to the present invention.
Figure 5:
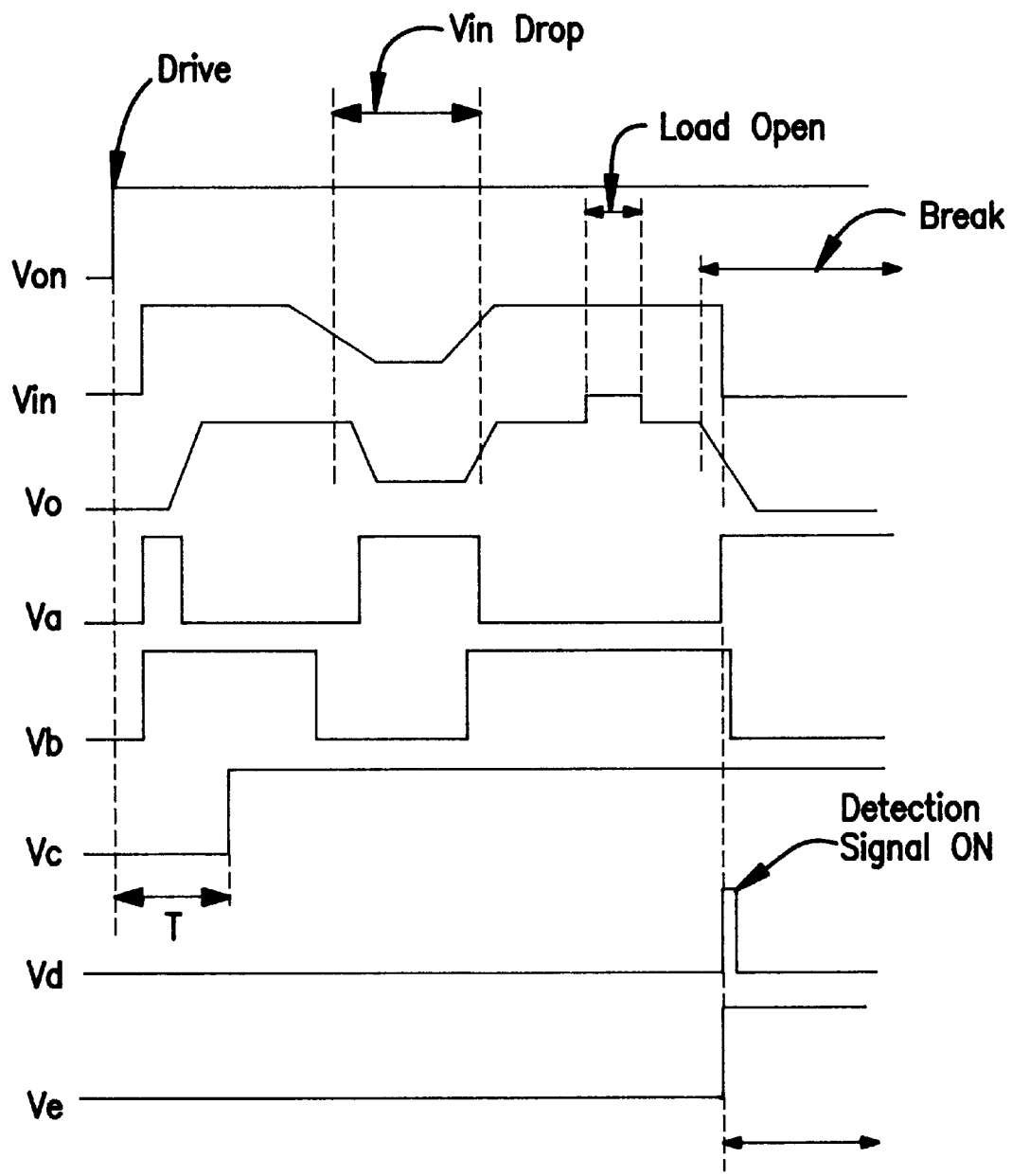
FIG. 5 is a time chart showing waveforms of the above individual signals of the circuit of FIG. 4.

FIG. 5 is a time chart showing waveforms of the above individual signals of the circuit of FIG. 4. The driving circuit 3 outputs the driving signal Vin in response to the supply of the control signal Von. The driving signal Vin is transmitted to the primary side of the piezoelectric transformer 4. At the same time, the driving signal Vin is also transmitted to the comparator 12 in the break-detection circuit 1. In response to the driving signal Vin, the piezoelectric transformer 4 shows a resonant vibration due to the piezoelectric effect whereby the input voltage is transformed into the output voltage Vo which appears on the secondary side of the piezoelectric transformer 4. The output voltage Vo is supplied to the load 5 and also transmitted to the comparator 11 in the break-detection circuit 1 so that the comparator 11 compares the output voltage Vo with the reference voltage VR1. If the output voltage Vo is lower than the reference voltage VR1, then a high level signal is outputted from the comparator 11. If, however, the output voltage Vo is higher than the reference voltage VR1, then a low level signal is outputted from the comparator 11. The reference voltage VR1 has previously been set at about the predetermined and required output voltage. In the comparator 11, a voltage divider is provided for voltage division for subsequent comparison process.

On the other hand, the comparator 12 compares the driving signal Vin with the reference voltage VR2. If the driving signal Vin is lower than the reference voltage VR2, then the comparator 12 outputs a low level signal. If, however, the driving signal Vin is higher than the reference voltage VR2, then the comparator 12 outputs a high level signal. The output from the comparator 12 is transmitted to the AND gate 14. The reference voltage VR2 is set at a critical level equal to or less than the input voltage Vin such that if the driving voltage is lower than the critical level, then it is impossible to output the output voltage Vo.

The timer circuit 13 is commenced to operate in response to the control signal Von so as to output a low level signal as the timer signal Vc for a time duration T. The time duration T of the timer 13 is a time duration from the supply of the control signal Von to the entry into a stable driving operation after rising up of the output voltage of the piezoelectric transformer in response to the driving signal Vin. The time duration T is, for example, 100 millisecond to a few seconds. The AND gate 14 outputs a high level signal or the break-detection signal Vd which indicates the break of the piezoelectric element when all of the signals Va, Vb and Vc from the comparator 11 and 12 and the timer circuit 13 are high levels. The AND gate 14 holds the judgement signal Vd at low level in response to the low level of the timer signal Vc, for which reason the latch circuit 2 holds the output discontinuation signal Ve at the low level whereby the driving circuit 3 is held to output the driving signal Vin which drives the piezoelectric transformer 4.

If the piezoelectric transformer 4 is in the normal operation state, at the end of the time duration T, the primary side voltage or the driving voltage Vin is sufficiently risen up and after the vibration time duration, the output voltage is outputted. For this reason, if the output Va is low level and also output Vb is high level, this means the normal operation state. Thus, the state of the AND gate 14 remains unchanged to output the low level and the output discontinuation signal Ve is held in the low level.

After the piezoelectric transformer 4 becomes the normally operational state, then the driving voltage Vin drops whereby the output voltage Vo is lower than the predetermined voltage. At this time, the comparison result signal Va is the low level whilst the comparison result signal Vb is the high level. The timer signal Vc is the high level. The AND gate 14 outputs the break detection signal Vd of the low level whereby the output discontinuation signal Ve of the latch circuit 2 remains at the low level.

During the above operations, if the output voltage Vo of the piezoelectric transformer 4 is returned to a level not less than the predetermined level, the comparison result signal Va is the low level whilst the comparison result signal Vb is the high level. The timer signal Vc is the high level. The judgement signal Vd is held at low level whereby the output discontinuation signal Ve of the latch circuit 2 remains at the low level.

If the output of the piezoelectric transformer 4 is open state, then the output voltage Vo is risen. At this time, the comparison result signal Va is the low level whilst the comparison result signal Vb is the high level. The timer signal Vc is the high level. The judgement signal Vd is held at low level whereby the output discontinuation signal Ve of the latch circuit 2 remains at the low level.

Even if the load opening state is recovered during the operations, then the comparison result signal Va is the low level whilst the comparison result signal Vb is the high level. The timer signal Vc is the high level. The judgement signal Vd is held at low level whereby the output discontinuation signal Ve of the latch circuit 2 remains at the low level.

If the piezoelectric transformer 4 is broken, then the output voltage Vo drops even the driving voltage Vin is the predetermined voltage level. For this reason, the comparison result signal Va is changed to the high level whilst the comparison result signal Vb remains at the high level. The timer signal Vc is the high level. The judgement signal Vd is changed to the high level whereby the output discontinuation signal Ve of the latch circuit 2 is changed to the high level. As a result, the driving circuit 3 discontinues the output of the driving voltage Vin in response to the high level of the output discontinuation signal Ve. Thus, the comparison result signal Va remains at the high level whilst the comparison result signal Vb is changed to the low level. The judgement signal Vd is low level although the latch circuit 2 is held to output the high level as the output discontinuation signal Ve. The latch circuit 2 holds the stop state of the driving signal Vin to the piezoelectric transformer 4. It is therefore possible to prevent any trouble following the multifunction of the piezoelectric transformer 4.

As a modification, in place of the discontinuation of the driving circuit by the output discontinuation signal, the break detection signal may be used to depend the subsequent process upon the system of use of the piezoelectric transformer, because the process following to the break of the piezoelectric transformer may be made by software. If, for example, a third order Rosen-type piezoelectric transformer is broken, then the output power is reduced whereby the light-on state might be kept even at a low brightness.

As described above, the driving circuit for the piezoelectric circuit is provided with a detector for detecting any break of the piezoelectric transformer by detection of a drop of the output voltage from the secondary side of the piezoelectric transformer even the driving voltage applied to the primary side of the piezoelectric transformer so that a break-detection signal can be outputted only when the piezoelectric transformer is broken.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A driving circuit for a piezoelectric transformer, said driving circuit comprising:

a driver means being electrically connected to a primary side of the piezoelectric transformer for generating a driving signal which is transmitted to the primary side of the piezoelectric transformer so that the piezoelectric transformer exhibits a vibration due to piezoelectric effect and generates a transformed output voltage on a secondary side thereof; and a detector means being electrically connected to an output side of the driver means for receipt of the driving signal from the driver means and also electrically connected to the secondary side of the piezoelectric transformer for receipt of the transformed output voltage from the piezoelectric transformer so that the detector means is capable of detecting a drop of the transformed output voltage when a voltage level of the driving signal is in an available range, said detector means comprising:

a first comparator being electrically connected to the secondary side of the piezoelectric transformer for receipt of the transformed output voltage from the piezoelectric transformer so that the first comparator compares the transformed output voltage with a first reference voltage and then outputs a first comparison result signal;

a second comparator being electrically connected to the output side of the driver means for receipt of the driving signal from the driver means so that the second comparator compares the driving signal with a second reference voltage and then outputs a second comparison result signal;

a timer means being electrically connected to an input side of the driver means for time counting operations to output a timer signal for a predetermined time duration after commencement of the supply of the driving signal; and a logic gate circuit being electrically connected to output sides of the first and second comparators and the timer means for receipt of the first and second comparison result signals and the timer signal for logical operators to output a detecting signal which indicates a drop of the transformed output voltage when a voltage level of the driving signal is in an available range.

2. The driving circuit as claimed in claim 1, further comprising a latch circuit between an output side of the detector means and the driver means.

3. A driving circuit for a piezoelectric transformer, said driving circuit comprising:

a driver circuit being electrically connected to a primary side of the piezoelectric transformer for generating a driving signal which is transmitted to the primary side of the piezoelectric transformer so that the piezoelectric transformer exhibits a vibration due to piezoelectric effect and generates a transformed output voltage on a secondary side thereof; and a detector circuit being electrically connected to an output side of the driver circuit for receipt of the driving signal from the driver circuit and also electrically connected to the secondary side of the piezoelectric transformer for receipt of the transformed output voltage from the piezoelectric transformer so that the detector circuit is capable of detecting a drop of the transformed output voltage when a voltage level of the driving signal is in an available range, said detector circuit comprising:

a first comparator being electrically connected to the secondary side of the piezoelectric transformer for receipt of the transformed output voltage from the piezoelectric transformer so that the first comparator compares the transformed output voltage with a first reference voltage and then outputs a first comparison result signal;

a second comparator being electrically connected to the output side of the driver circuit for receipt of the driving signal from the driver circuit so that the second comparator compares the driving signal with a second reference voltage and then outputs a second comparison result signal;

a timer circuit being electrically connected to an input side of the driver circuit for time counting operations to output a timer signal for a predetermined time duration after commencement of the supply of the driving signal; and a logic gate circuit being electrically connected to output sides of the first and second comparators and the timer circuit for receipt of the first and second comparison result signals and the timer signal for logical operators to output a detecting signal which indicates a drop of the transformed output voltage when a voltage level of the driving signal is in an available range.

4. The driving circuit as claimed in claim 3, further comprising a latch circuit between an output side of the detector means and the driver means.

5. A driving circuit for a piezoelectric transformer, said driving circuit comprising:

a DC power supply;

a driver circuit powered by the DC power supply, the driver circuit producing a driving signal connected to a primary side of the piezoelectric transformer; and a detector circuit having as inputs the DC power supply, the driving signal produced by the driver circuit, and a transformed output voltage from a secondary side of the piezoelectric transformer, the detector circuit producing a fault detection signal which is connected as an input to the driver circuit;

wherein the detector circuit sets the fault detection signal to an active state when, after an initial delay time has passed after the DC power supply has become active, both the driving signal and the transformed output voltage are detected to be at invalid levels.

6. The driving circuit of claim 5, wherein the detector circuit comprises:
- a first comparator having as inputs a first reference voltage and the transformed output voltage;
- a second comparator having as inputs a second reference voltage and the driving signal;
- a timer circuit having as an input the DC voltage supply; and
- a logic circuit which receives outputs of the timer and the first and second comparators and produces the fault detection signal, the fault detection signal being in an active state when the outputs of the first comparator, the second comparator, and the timer circuit are all active.

7. The driving circuit of claim 6, wherein the logic circuit comprises a latch circuit which holds the fault detection signal in the active state once the fault detection circuit has set the fault detection signal to said active state.

8. The driving circuit of claim 6, wherein the first comparator produces an active output when the transformed output voltage falls below the first reference voltage.

9. The driving circuit of claim 8, wherein the second comparator produces an active output when the driving signal rises above the second reference voltage.

10. The driving circuit of claim 9, wherein the timer circuit produces an active output when a predetermined length of time has passed from the DC power supply having been turned on.

11. The driving circuit of claim 10, wherein the logic circuit comprises a latch circuit which holds the fault detection signal in the active state once the fault detection circuit has set the fault detection signal to said active state.

12. The driving circuit of claim 6, wherein the fault detection signal, when in the active state, causes the driver circuit to no longer produce the driving signal.

* * * * *